United States Patent [19]
Andricacos et al.

[11] Patent Number: 5,937,320
[45] Date of Patent: Aug. 10, 1999

[54] BARRIER LAYERS FOR ELECTROPLATED SNPB EUTECTIC SOLDER JOINTS

[75] Inventors: Panayotis Constantinou Andricacos, Croton-on-Hudson; Madhav Datta, Yorktown Heights; Wilma Jean Horkans, Ossining; Sung Kwon Kang, Chappaqua; Keith Thomas Kwietniak, Highland Falls, all of N.Y.

[73] Assignee: International Business Machines Corporation, Armonk, N.Y.

[21] Appl. No.: 09/057,205

[22] Filed: Apr. 8, 1998

[51] Int. Cl.[6] .................................................. H01L 21/44
[52] U.S. Cl. ........................... 438/614; 438/612; 438/613
[58] Field of Search .................................... 438/584, 597, 438/612, 613, 614

[56] References Cited

U.S. PATENT DOCUMENTS

| | | |
|---|---|---|
| 5,162,257 | 11/1992 | Yung . |
| 5,391,514 | 2/1995 | Gall et al. . |
| 5,470,787 | 11/1995 | Greer . |
| 5,634,268 | 6/1997 | Dalal et al. . |

FOREIGN PATENT DOCUMENTS

| | | |
|---|---|---|
| 0 603 296 B1 | 6/1994 | European Pat. Off. . |
| WO 96/30933 | 10/1996 | WIPO . |

OTHER PUBLICATIONS

Jean Audet, et al., "Low Cost Bumping Process for Flip Chip", Proc. 1995 International Flip Chip, BGA, and Ado Pkg. Symposium ITAP 95, '95 Flip Chip, BGA, TAB & AP Symposium, pp. 16–21 (1995).

M. Data, et al., "Electrochemical Fabrication of Mechanically Robust PbSn C4 Interconnections", J. Electrochem. Soc., vol. 142, No. 11, pp. 3779–3785 (Nov. 1995).

J.D. Mis, et al., "Flip Chip Production Experience: Some Design, Process, Reliability, and Cost Considerations", ISHM '96 Proceedings, Proc. 1996 International Symposium on Microelectronics SPIE vol. 2920, pp. 291–295 (1996).

S.K. Kang, et al., "Interfacial Reactions During Soldering With Lead–Tin Eutectic and Lead (Pb)–Free, Tin–Rich Solders", Journal of Electronic Materials, vol. 25, No. 7, pp. 1113–1120 (1996).

Eric Jung, et al., "The Influence of NiSn Intermetallics on the Performance of Flip Chip Contacts Using a Low Cost Electroless Nickel Bumping Approach", IEPS Proceedings of the Technical Conference, 1996 Electronics Packaging Conference, Austin, Texas, pp. 14–25 (Sep. 29–Oct. 1, 1996).

*Primary Examiner*—Charles Bowers
*Assistant Examiner*—Martin Sulsky
*Attorney, Agent, or Firm*—Scully, Scott, Murphy & Presser; Robert M. Trepp

[57] ABSTRACT

The present invention provides a means of fabricating a reliable C4 flip-chip structure for low-temperature joining. The electrochemically fabricated C4 interconnection has a barrier layer between the electroplated tin-rich solder bump and the ball-limiting metallurgy that protects the terminal metal in the ball-limiting metallurgy from attack by the Sn in the solder. The barrier layer is electroplated through the same photoresist mask as the solder and thus does not require a separate patterning step. A thin layer of electroplated nickel serves as a reliable barrier layer between a copper-based ball-limiting metallurgy and a tin-lead (Sn—Pb) eutectic C4 ball.

18 Claims, 3 Drawing Sheets

BARRIER LAYERS FOR ELECTROPLATED SNPB EUTECTIC SOLDER JOINTS

DESCRIPTION

1. Field of the Invention

The present invention relates to electrochemical fabrication of low-melting solder interconnections between semiconductor chips and temperature-sensitive substrates and, more particularly, to the electrochemical formation of a barrier layer between SnPb eutectic solder and the ball-limiting metallurgy that defines the solder pad.

2. Background of the Invention

C4 (Controlled-Collapse Chip Connection) is a means of connecting IC (integrated circuit) chips to substrates in electronic packages. Moreover, C4 is a flip-chip technology in which the interconnections are small solder balls on the chip surface. Because it is an area array, C4 technology represents the highest density scheme known in the art for chip interconnections.

C4 technology has been employed by IBM since the 1960s and has proven highly reliable in the semiconductor field. Historically, the PbSn solder was evaporated through a metal mask. In the 1990s, electrochemical fabrication of C4 interconnections was introduced (See, for example, M. Datta, et al., "Electrochemical Fabrication of Mechanically Robust PbSn Interconnections", J. Electrochem. Soc., 142, 3779 (1995); U.S. Pat. No. 5,162,257 to Yung; and WO 96/30933). Electroplating is more extendible than evaporation to small C4-pad dimensions, closer pad spacing, larger wafers, and lower-melting solders (which have a higher content of Sn).

The top layers of the integrated-circuit chip are wiring levels, separated by insulating layers of dielectric material that provide input/output for the device. In C4 structures, the chip wiring is terminated by a plurality of metal films that form the ball-limiting metallurgy (BLM), which is also referred to in the prior art as under-bump metallurgy (UBM). The ball-limiting metallurgy defines the size of the solder bump after reflow, provides a surface that is wettable by the solder and that reacts with the solder to provide good adhesion and acceptable reliability under mechanical and heat stress, and is a barrier between the integrated-circuit device and the metals in the interconnection.

When the chip is attached to the ceramic module (e.g. an MCM, (multi-layer ceramic module)), solder with a high Pb content, and consequently a high melting point is used in the C4 joint. The high-Pb solder is reflowed well above 300° C. The Sn content of high-Pb solders is typically less than 5% by weight. A typical ball-limiting metallurgy structure is a thin film stack consisting of Cr or TiW (at the chip surface), CrCu, and then Cu. The Sn in the solder reacts readily with Cu to form intermetallics, which provide adhesion between the solder and the ball-limiting metallurgy. For solders with less than about 5% Sn by weight, a thin film (e.g. ≦0.5 $\mu$m) of Cu is a suitable terminal layer for the ball-limiting metallurgy.

Reflow temperatures above 300° C. are appropriate for ceramic modules but are too high for more heat-intolerant materials (such as laminates). Direct chip attach (DCA) and similar structures therefore use a lower-melting solder, generally the SnPb eutectic with a 63% Sn content by weight.

Tin, and thus also Sn-based solder, reacts rapidly with Cu metal, especially at the elevated temperatures of solder reflow and joining. The Cu dissolves in the Sn forming a layer of Cu/Sn intermetallics with a very non-uniform thickness at the solder-Cu interface (S. K. Kang, et al., "Interfacial Reactions During Soldering with Lead-Tin Eutectic and Lead (Pb)-Free, Tin-Rich Solders", J. Electronic Mater., 25, 1113 (1996)).

Even though the reflow temperature for SnPb eutectic is about 100° C. lower than that for 97Pb3Sn, a 0.5 $\mu$m film of Cu would be essentially consumed in intermetallic formation during reflow. The complete conversion of the Cu solderable layer to a layer of Cu—Sn intermetallic results in a loss of mechanical reliability. Thus, the BLMs used to join chips to MCMs are not suitable for DCA to laminates or similar materials, contrary to what is disclosed in European Patent Application No. 0 603 296 B. Experience has shown that interconnections with no remaining Cu will not survive the mechanical stresses of thermal cycling. Thus, an adequate barrier layer (BL) is needed between the Sn-based solder and the ball-limiting metallurgy or other chip-side metallurgy.

A thin nickel layer between the Cu and SnPb eutectic solder can reduce the dissolution of the Cu in the solder (See, S. K. Kang, et al., Supra). The Ni/Sn intermetallic layer formed during a melting cycle is thinner and more uniform than the Cu/Sn intermetallic layer formed under the same conditions.

In the art, there is a variety of alternatives to Cu as a solderable layer for low-temperature C4 structures. These are implemented specifically to prevent excessive consumption of a Cu ball-limiting metallurgy layer by reaction with the Sn in the solder.

One approach, especially suited to implementation in electrochemically fabricated C4s, is the use of a stand-off between the ball-limiting metallurgy and the SnPb eutectic solder. In this approach, the solder that is directly on the chip surface is a high-Pb, high-melting solder; to this point, the processing is the same as that of high-temperature C4s for joining to MCMs. The high-Pb solder on the chip is compatible with the Cu terminal layer in the ball-limiting metallurgy. Furthermore, in low-temperature C4 attach, the high-Pb solder need not be reflowed. The second, lower-melting solder that forms the interconnection—SnPb eutectic, pure Sn that forms SnPb eutectic during melting, or another low-melting solder—is deposited either on the chip on top of the high-Pb solder or on the substrate (See, U.S. Pat. No. 5,634,268 to Dalal, et al.; U.S. Pat. No. 5,391,514 to Gall, et al.; J. D. Mis, et al., "Flip Chip Production Experience: Some Design, Process, Reliability, and Cost Considerations", Proc. 1996 International Symposium on Microelectronics, SPIE Vol. 2920, p. 291). During reflow and joining, the two solders can intermix, and the low-melting solder will wet the sides of the pedestal of high-Pb solder. As a result of the solder intermixing, the melting temperature will be broadened. The wetting of the sides of the high-Pb solder pedestal allows the high-Sn solder to attack the Cu terminal layer of the ball-limiting metallurgy at the periphery of the pad.

Another low-temperature C4 structure that uses a pedestal between the ball-limiting metallurgy and the solder joint comprises a through-mask evaporated solder stack of three layers: Sn, Pb, and Sn (See, U.S. Pat. No. 5,470,787 to Greer). The Sn at the chip surface is limited to the amount necessary to form the intermetallic that provides adhesion of the C4 to the under-bump metallurgy; there is too little Sn to cause excess consumption of the Cu in the under-bump metallurgy. The Sn at the top mixes with the Pb stand-off to provide a low-melting solder. This structure requires the evaporation of Sn, which has a low vapor pressure and is thus difficult to evaporate at practical rates.

Structures without a stand-off, in which the entire bulk of the interconnection consists of the Sn-rich solder, require either a different ball-limiting metallurgy (from that suitable to high-melting solder) or a barrier to react with the ball-limiting metallurgy. Barriers consisting of electroless NiP (with a thin Au layer to protect against oxidation) have been used with C4s formed by screening, injection molding, stencil printing, mechanical bumping, or solder ball placement (See, for example, J. Audet, et al., "Low Cost Bumping Process For Flip Chip", Proc. 1995 International Flip Chip, BGA, and Advanced Packaging Symposium, p. 16; E. Jung, et al., "The Influence of NiSn Intermetallics on the Performance of Flip Chip Contacts using a Low Cost Electroless Nickel Bumping Approach", Proc. 1996 Electronics Packaging Conference, IEPS, p. 14). The electroless NiP process has the advantage of depositing only on the underlying Al(Cu) metallurgy, and thus it does not necessarily require a masking step. On the other hand, the NiP deposition process entails hydrogen gas evolution, and good NiP deposits cannot be obtained through photoresist masks with small, deep features. This last property makes them unfavorable for use as barrier layers for electroplated C4s.

In view of the drawbacks mentioned with prior art processes of fabricating C4 structures containing barrier layers, there is a need to provide a new process for the formation of a barrier layer between the terminal layer of the ball-limiting metallurgy and the Sn-based solder ball.

SUMMARY OF THE INVENTION

Accordingly, one aspect of the present invention relates to a method of fabricating a reliable structure with low-melting, high-Sn SnPb solder balls.

Another aspect of the present invention relates to a C4 structure that prevents the attack of the ball-limiting metallurgy by Sn in low-melting, high-Sn SnPb solders.

A further aspect of the present invention is to provide an electrochemically fabricated C4 structure which is low in cost and is extendible to smaller C4 dimensions and smaller pad pitches than heretofore obtainable using prior art methods.

A yet further aspect of the present invention relates to an electrochemically fabricated C4 structure in which the barrier layer is electroplated through the same mask as the solder; therefore the barrier layer does not require a separate patterning step.

An additional aspect of the instant invention relates to an undercut of the etched ball-limiting metallurgy relative to the electroplated barrier layer which prevents attack of the terminal metal layer of the ball-limiting metallurgy by wicking of solder at the edge and relieves stresses in the C4 structure.

A final aspect of the present invention relates to a C4 structure that can be used for the direct attachment of chips to heat-sensitive materials, such as circuit boards.

These and other aspects and advantages are achieved in the present invention by a method which includes fabricating a C4 with low-melting SnPb solder on an integrated-circuit wafer with input/output connections on its top surface. Specifically, the method of the present invention comprises the steps of:

(a) depositing a plurality of blanket metal layers on a passivated surface of a semiconductor wafer, wherein said passivated surface of said semiconductor wafer comprises at least one metallic pad embedded in said wafer and a passivating layer having an opening therein on top of said wafer;

(b) applying a photoresist material to said plurality of blanket metal layers;

(c) patterning said photoresist material to provide a region for solder bump formation;

(d) electroplating a metal barrier layer on said region for solder bump formation;

(e) electroplating a C4 solder bump material on said electroplated metal barrier layer;

(f) removing said photoresist material; and (g) etching said at least one blanket metal layer using said C4 solder bump material as a mask.

If desired, the C4 solder ball material in step (g) may be reflowed prior to joining with a semiconductor package.

DETAILED DESCRIPTION OF THE INVENTION

Figure 1:
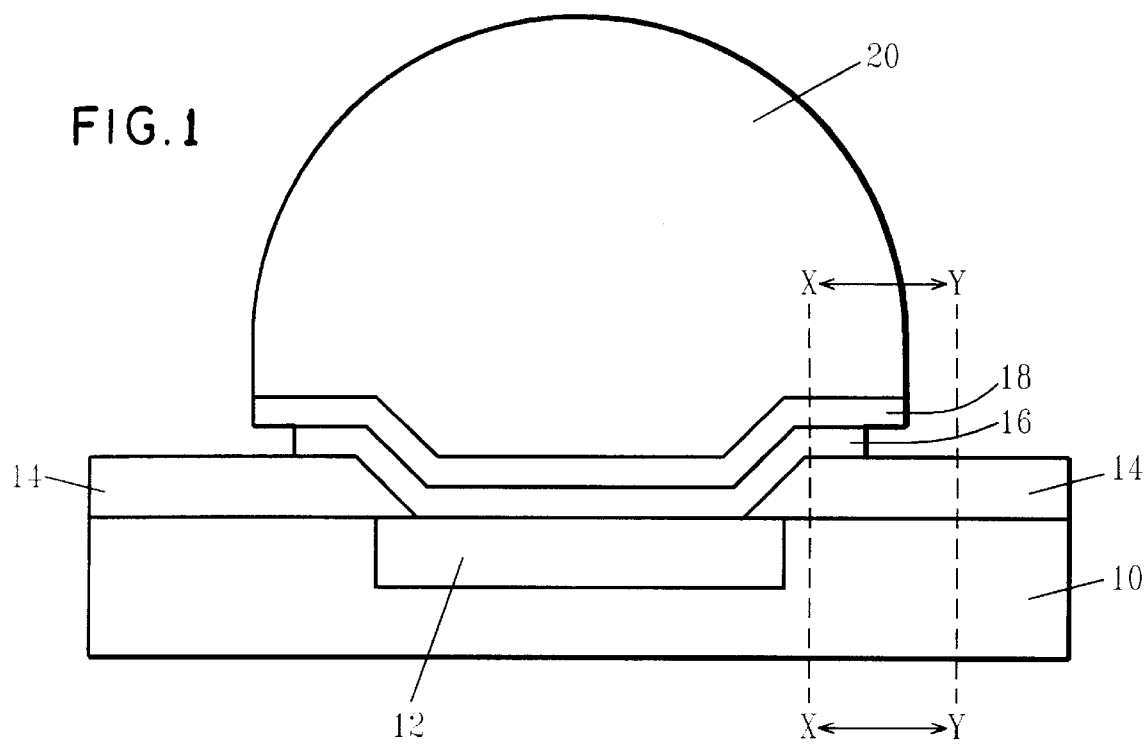
FIG. 1 shows a C4 solder ball with a barrier layer between the solder and the ball-limiting metallurgy prepared in accordance with the method of the present invention.

The present invention, which provides an electroplated barrier layer between the ball-limiting metallurgy and eutectic SnPb solder in electroplated C4 structures, will now be described in more detail with reference to the accompanying drawings wherein like reference numerals are used for like and corresponding elements of the drawings. The barrier layer produced in the present invention requires no patterning steps; it is plated through the same photoresist mask as the solder. The barrier layer is wettable by the solder and has good adhesion to the solder. Additionally, the barrier layer of the present invention enables the use of alternative BLMs. The alternative BLMs may consist of metals other than Cu. They may additionally be thinner than commonly used BLMs and therefore may be easier and less expensive to fabricate and to pattern.

Reference is made to FIG. 1 which shows a typical interconnect structure of the present invention prior to joining with a temperature-sensitive substrate. Specifically, the interconnect structure of FIG. 1 comprises a semiconductor wafer 10 having a metallic pad 12 embedded therein and a passivating layer 14 on predetermined areas of metallic pad 12 and semiconductor wafer 10. The structure further comprises ball-limiting metallurgy 16 on top of metallic pad 12 and a portion of passivating layer 14. On top of ball-limiting metallurgy 16 is barrier layer 18 and solder ball 20.

The semiconductor wafer employed in the present invention comprises a conventional semiconducting material such as Si, Ge, SiGe, GaAs, GaP, InAs, InP and the like. A highly preferred semiconducting material is Si. The wafer typically contains a plurality of active integrated circuit (IC) devices. For clarity these active IC devices are not shown in the drawings of the present invention.

The metallic pads which are used in the present invention to form a contact between the IC devices and the outside world are composed of a metal such as, but not limited to: Cu, Al and Cu-doped Al. A highly preferred metal for metallic pad 12 is Cu-doped Al.

Passivating layer 14 is formed of a material such as a polyimide, silicon dioxide or silicon nitride. In accordance with the present invention, passivating layer 14 is not covering the entire surface of metallic pad 12. Instead it has an opening therein which exposes metallic pad 12.

The term "ball limiting metallurgy" or "BLM" is used herein to denote a plurality of blanket metal layers which are deposited on the exposed surface of metallic pad 12 and passivating layer 14. In accordance with the present invention, BLM 16 may comprise at least a first adhesive metal layer, an optional second adhesive metal layer and a wettable (terminal) metal layer. For simplicity, this plurality of metal layers is represented in FIG. 1 as BLM 16.

Figure 2:
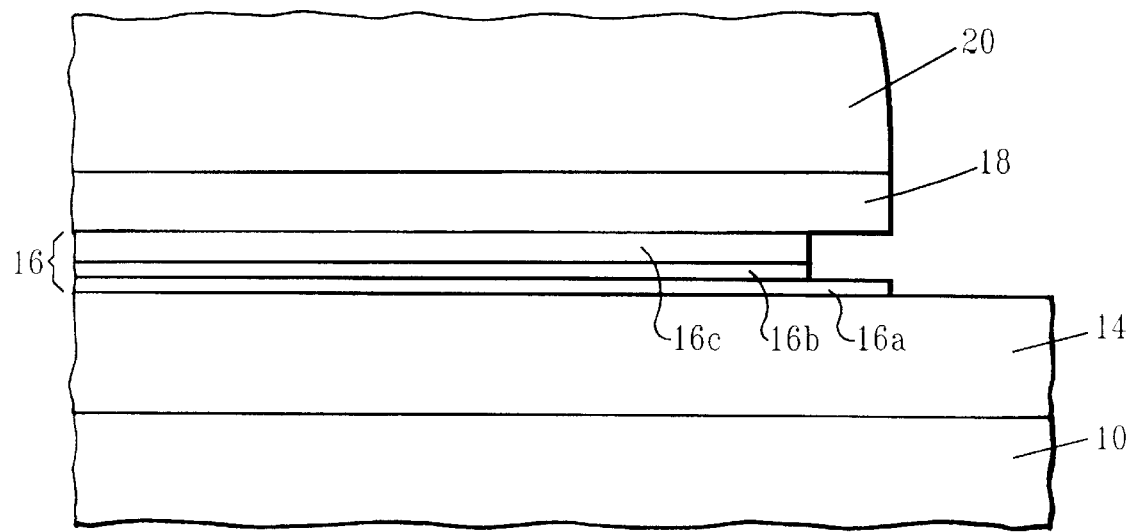
FIG. 2 shows a detailed portion of FIG. 1 about the regions labeled x and y.

FIG. 2, which is a detailed drawing of FIG. 1 about the x–y regions, illustrates the various metal layers that make up BLM 16. As stated above, BLM 16 comprises a plurality of metal layers which may comprise a first adhesion metal layer 16a; an optional second adhesion metal layer 16b; and a wettable terminal metal layer 16c.

The first adhesion metal layer which is deposited directly on metallic pad 12 and on passivating layer 14 serves to provide adhesion between the interconnect and the wafer. Moreover, first adhesion layer 16a also prevents any interaction between the interconnect material and the underlying IC devices on the semiconductor wafer. First adhesion layer 16a may be composed of a metal or metal alloy that is capable of adhering to metallic pad 12 and passivating layer 14. Suitable metals for first adhesion layer 16a include, but are not limited to: Ti, W, Cr or alloys thereof. Of these materials, it is preferred that first adhesion layer 16a be composed of TiW.

Second adhesion layer 16b is employed in the present invention when additional adhesion is required. The second adhesion layer normally comprises a phased CrCu alloy composed predominantly of Cr at the interface with first adhesive layer 16a and predominantly of Cu at the interface with wettable terminal metal layer 16c.

The terminal metal layer of BLM 16 ensures wetting by solder, mechanical strength and low contact resistance. Wettable terminal metal layer 16c is typically composed of Cu, Ni, Co, Fe or alloys thereof. Of these metals, it is highly preferred that Cu be employed as wettable terminal metal layer 16c.

In order to prevent attack of wettable terminal metal layer 16c by the Sn in solder ball 20, a barrier layer 18 is formed on top of wettable terminal metal layer 16c. Suitable materials for the barrier layer include, but are not limited to: Ni, Fe, Co or alloys thereof. In a highly preferred embodiment of the present invention, barrier layer 18 is composed of Ni.

In the electrochemically fabricated C4 structure of FIG. 1 and FIG. 2, the optional second adhesion layer 16b and wettable terminal metal layer 16c can be undercut relative to the barrier layer.

The above provides a detailed description regarding the final interconnect structure that is produced by the method of the present invention. The following description provided hereinbelow provides a detailed description on how such a structure is fabricated. Reference is made to FIGS. 3(a)–(h) which show the various processing steps employed in the present invention for preparing an electrochemically fabricated C4 interconnect containing an electroplated barrier layer.

Figure 3A:
FIGS. 3(a)–(h) show the processing steps employed in the present invention for fabricating the structure shown in FIG. 1.

Specifically, FIG. 3(a) shows a conventionally fabricated semiconductor wafer 10 which contains completed circuitry (not shown), metallic pad 12 embedded in the wafer, and a passivating layer 14 having an opening therein located on a portion of said metallic pad 12. This structure shown in FIG. 3(a) is fabricated using techniques that are well known to those skilled in the art. Since such techniques are well known to those skilled in the art and are not critical to the present invention, they will not be discussed herein.

Figure 3B:
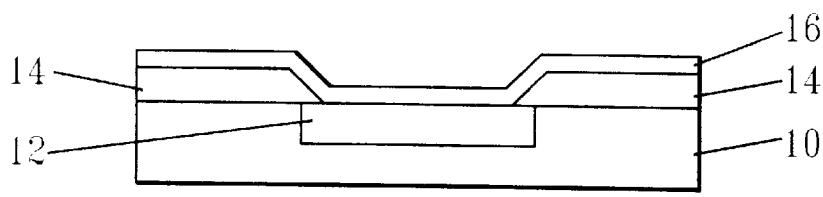

The first step of the method of the present invention is shown in FIG. 3(b). Specifically, FIG. 3(b) shows the blanket deposition of a plurality of metal layers which is used in forming the BLM. This plurality of metal layers is represented as a single layer 16 in the drawings. The plurality of metal layers is used in the present invention to form BLM 16. This includes the first adhesion layer 16a, the second adhesion layer 16b and the wettable terminal metal layer 16c mentioned hereinabove. Thus, in the present invention BLM 16 may comprise a layer of TiW (as the first adhesion layer), a layer of CrCu (as the second adhesion layer) and a layer of Cu as the wettable terminal metal layer.

BLM 16 is formed by depositing the suitable metal layers on top of metallic pad 12 and passivating layer 14 using any conventional deposition technique well known to those skilled in the art including, but not limited to: evaporation, chemical vapor deposition (CVD), plasma enhanced vapor deposition, electro- or electroless plating and the like. The overall thickness of each of the metal layers used in forming BLM 16 is not critical to the present invention as long as BLM 16 is capable of carrying a current during plating of the BLM and the solder. Additionally, the BLM must be thick enough to provide sufficient adhesion between any current conducting layer present in the structure and passivating layer 14.

In one optional embodiment of the present invention, which is not shown in the drawings, BLM 16 is capped with a thin layer of less than 50 nm of a metal such as Au or Cu so as to promote uniform nucleation of the barrier layer. This embodiment is applicable when the terminal metal layer is not Cu.

Figure 3C:
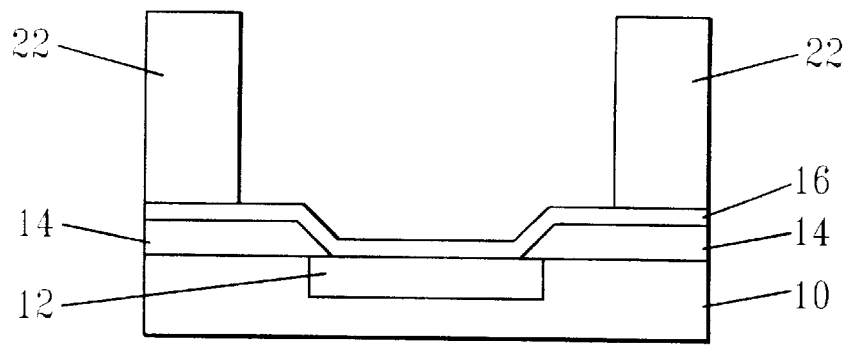

Next, as shown in FIG. 3(c), a thick photoresist material 22 is deposited on predetermined areas of BLM 16 not covering metallic pad 12, and the C4 pattern is formed using standard photolithographic techniques.

Any photoresist material, including dry-films or liquid photoresists, may be employed in the present invention and may be formed using techniques well known to those skilled in the art. Although the thickness of the photoresist is not critical, good results are had when the photoresist is at least as thick as the combined thickness of electroplated barrier layer 18 and the electroplated solder.

Figure 3D:
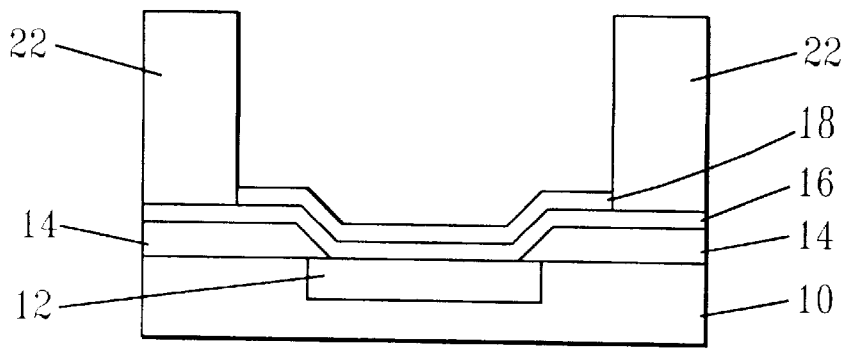

The next step of the present invention involves the electroplating of barrier layer 18 through photoresist 22. This step of the present invention is shown in FIG. 3(d). Specifically, barrier layer 18 is formed by electroplating Ni from a solution of its salt using plating conditions that are well known to those skilled in the art which are capable of electroplating Ni at high current efficiency. The $Ni^{2+}$ may be present as its chloride salt, a mixture of its chloride and sulfate salts, or its sulfainate salt. Typical plating parameters that can be employed include, but are not limited to: $Ni^{2+}$ concentration of from about 0.1 to about 1.5 mole/l; boric acid buffer of from about 0 to about 0.8 mole/l; pH from about 2 to about 5; temperature of from about 20° to about 70° C.; and current density of from about 5 to 30 mA/cm$^2$.

Plating baths may also contain anode depolarizers and agents like stress relievers and wetting agents that improve the properties of the Ni deposition.

The aforementioned operating conditions are sufficient to form a barrier layer that has a thickness of from about 0.2 to about 5.0 µm or higher.

In another optional embodiment of the present invention, which is also not illustrated in the drawings, a cap layer composed of Au, Cu, Sn or a similar metal may be formed on the surface of barrier layer 18. These capping materials may be deposited by electroplating, electroless plating or exchange deposition through the photoresist pattern.

Figure 3E:
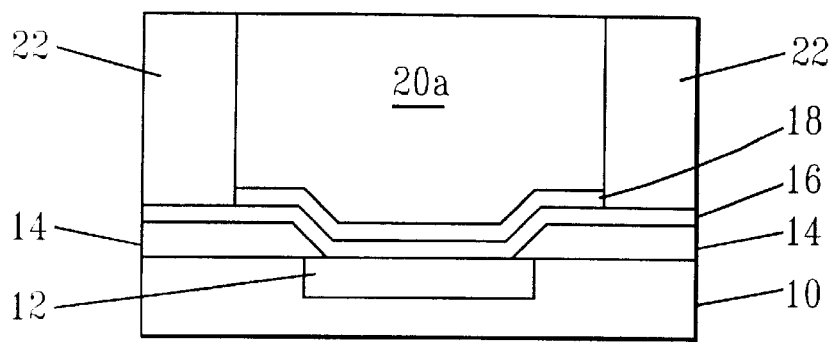

After formation of electroplated barrier layer 18, a solder bump 20a composed of Sn, Pb and alloys thereof is electroplated through photoresist 22 (See FIG. 3(e)). A highly preferred solder material employed in the present invention is eutectic SnPb alloy. The term "eutectic" is used herein to denote a PbSn alloy having the composition 63% Sn, 37% Pb, by weight. Solder bump 20a is formed by electroplating using the following conditions, which are suitable for forming a solder bump having a thickness of up to about 100 μm or higher: The eutectic SnPb alloy can be plated from methane sulfonic acid solutions of $Sn^{2+}$ and $Pb^{2+}$ Plating baths based on other acids can also be used, but the methane sulfonic acid bath is highly preferred in the present invention. Specifically, the $Sn^{2+}$ concentration of the preferred bath is from about 0.1 to about 0.3 mole/l; the $Pb^{2+}$ concentration is from about 0.04 to about 0.2 mole/l; methane sulfonic acid concentration is from about 1 to about 2.5 mole/l; the temperature is about room temperature; and the current density is from about 20 to about 100 $mA/cm^2$.

Organic addition agents are typically required for dense and compact deposits. The addition agents supplied by vendors of plating baths give good performance in C4 solder plating. The plating solution concentration can be optimized to yield the SnPb eutectic composition for the particular addition agents used.

Figure 3F:
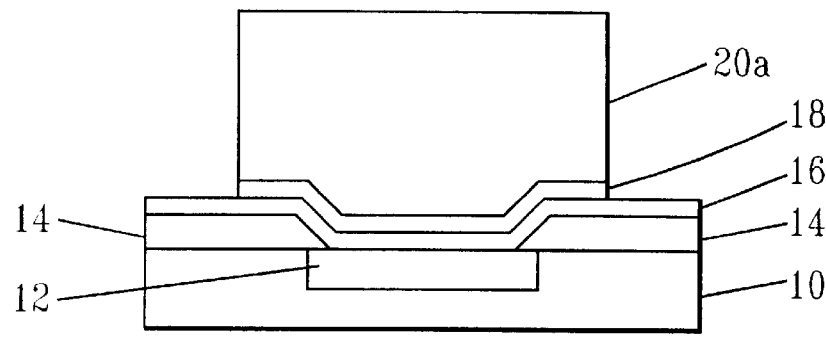
Figure 3G:
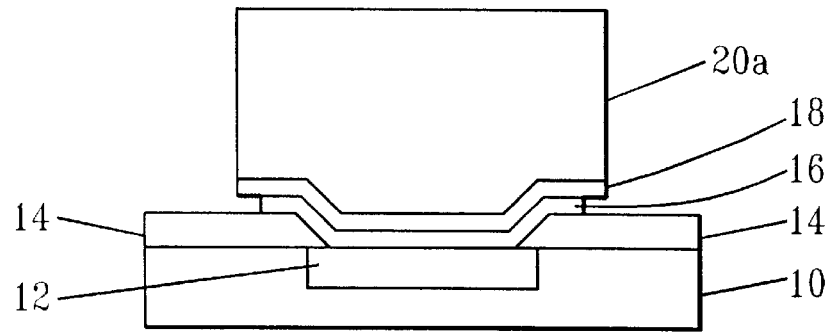

FIG. 3(f) shows the step of removing the photoresist using techniques well known to those skilled in the art. Next, as shown in FIG. 3(g), BLM 16 is etched to provide an undercut of the metallic layers relative to barrier layer 18 using solder bump 20a as a mask. Electrochemical etching, chemical etching or a combination thereof may be employed in the present invention depending upon the metal layers found in BLM 16. For example, electrochemical etching is used to pattern the CrCu and Cu layers whereas chemical etching is used to pattern the TiW layer.

Electrochemical etching employs an electrolyte containing a mixture of 0.4 mole/l $K_2SO_4$ and 1.5 mole/l glycerol (as taught in U.S. Pat. No. 5,486,282 to Datta, et al.; the contents of which are incorporated herein by reference). Selective removal of TiW by chemical etching is accomplished in a solution of $H_2O_2$, EDTA and $K_2SO_4$ at 60° C. (as taught in U.S. Pat. No. 5,462,638 to Datta, et al.; the contents of which are also incorporated herein by reference). The Ni barrier layer remains protected during both the electroetching and the chemical etching processes.

As stated above, the etching employed in the present invention provides an undercut of metallic layers (16a, 16b or 16c) relative to barrier layer 18. This undercut protects the BLM from attack by the solder and it also relieves stresses in the final structures.

Figure 3H:
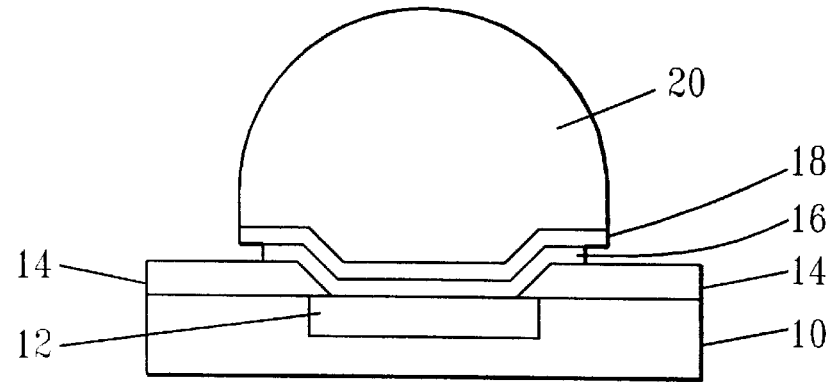

As shown in FIG. 3(h), the solder bump 20a may be optionally reflowed to form solder ball 20. The wafer is then ready for further processing including dicing and joining with a substrate.

While the present invention has been particularly shown and described with respect to preferred embodiments thereof, it will be understood by those skilled in the art that the foregoing and other changes in form and detail may be made therein without departing from the spirit and scope of the instant invention. It is therefore intended that the present invention not be limited to the exact forms described and illustrated, but fall within the scope of the appended claims.

Having thus described our invention, what we claim as new, and desire to secure the Letters Patent is:

1. A method of forming C4 bumps on metallic pads embedded in a semiconductor wafer comprising the steps of:
   (a) depositing a plurality of blanket metal layers on a passivated surface of a semiconductor wafer, wherein said passivated surface of said semiconductor wafer comprises at least one metallic pad embedded therein and a passivating layer having an opening therein on top of said wafer;
   (b) applying a photoresist material to said plurality of blanket metal layers;
   (c) patterning said photoresist material to provide a region for C4 solder bump formation;
   (d) electroplating a metal barrier layer on said region provided in step (c);
   (e) fabricating a C4 solder bump material on said electroplating metal barrier layer;
   (f) removing said photoresist material, and
   (g) etching said plurality of blanket metal layers using said C4 solder bump material as a mask.

2. The method of claim 1 wherein said plurality of blanket metal layers includes at least a first adhesion layer and at least a wettable terminal metal layer.

3. The method of claim 2 wherein said plurality of blanket metal layers further comprises a second adhesion layer between said first adhesion layer and said wettable terminal metal layer.

4. The method of claim 3 wherein said second adhesion layer is composed of CrCu.

5. The method of claim 3 wherein the step of etching said plurality of blanket metals includes the step of electrochemical etching of both said wettable terminal metal layer and said second adhesion layer.

6. The method of claim 5 wherein said electrochemical etching of said wettable terminal metal layer and said second adhesion layer provides an undercut relative to said barrier layer.

7. The method of claim 2 wherein said first adhesion layer is composed of a metal selected from the group consisting of Ti, W, Cr and alloys thereof.

8. The method of claim 7 wherein said first adhesion layer is composed of TiW.

9. The method of claim 2 wherein said wettable terminal metal layer is composed of a metal selected from the group consisting of Cu, Ni, Fe, Au and alloys thereof.

10. The method of claim 9 wherein said wettable terminal metal layer is composed of Cu.

11. The method of claim 2 wherein the step of etching said plurality of blanket metal layers includes the step of electrochemical etching of said wettable terminal metal layer.

12. The method of claim 2 wherein said etching of said plurality of blanket metals includes the step of chemical etching of said first adhesion layer.

13. The method of claim 1 wherein said electroplated metal barrier layer is composed of a metal selected from the group consisting of Ni, Co, Fe and alloys thereof.

14. The method of claim 13 wherein said electroplated metal barrier layer is composed of Ni.

15. The method of claim 13 wherein said electroplated metal barrier layer is composed of NiFe.

16. The method of claim 1 wherein said C4 solder bump material is a solder selected from the group consisting of Sn, Pb, and alloys thereof.

17. The method of claim 16 wherein said C4 solder bump material is an alloy of Sn and Pb having a eutectic composition.

18. The method of claim 1 further comprising reflowing said C4 solder bump material to form a solder ball.

* * * * *